United States Patent
Becker

[11] Patent Number: 5,883,854
[45] Date of Patent: Mar. 16, 1999

[54] DISTRIBUTED BALANCED ADDRESS DETECTION AND CLOCK BUFFER CIRCUITRY AND METHODS FOR MAKING THE SAME

[75] Inventor: Scott T. Becker, San Jose, Calif.

[73] Assignee: Artisan Components, Inc., Sunnyvale, Calif.

[21] Appl. No.: 928,714

[22] Filed: Sep. 12, 1997

[51] Int. Cl.⁶ .................................................. G11C 8/00
[52] U.S. Cl. ............................. 365/233.5; 365/230.08; 365/189.05
[58] Field of Search ........................ 365/233.5, 230.08, 365/189.05

[56] References Cited

U.S. PATENT DOCUMENTS

| | | | |
|---|---|---|---|
| 4,128,900 | 12/1978 | Lappington | 365/94 |
| 5,019,889 | 5/1991 | Hamano et al. | 365/233.5 |
| 5,029,135 | 7/1991 | Okubo | 365/203 |
| 5,146,427 | 9/1992 | Sasaki et al. | 365/189.05 |
| 5,214,609 | 5/1993 | Kato et al. | 365/230.01 |
| 5,311,471 | 5/1994 | Matsumoto et al. | 365/189.05 |
| 5,323,360 | 6/1994 | Pelley, III | 365/233.5 |
| 5,335,207 | 8/1994 | Takamoto | 365/233.5 |
| 5,404,334 | 4/1995 | Pascucci et al. | 365/210 |
| 5,414,663 | 5/1995 | Komarek et al. | 365/210 |
| 5,459,689 | 10/1995 | Hikichi | 365/189.09 |
| 5,555,521 | 9/1996 | Hamada et al. | 365/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,629,901 | 5/1997 | Ho | 365/230.05 |
| 5,636,161 | 6/1997 | Mann | 365/185.21 |
| 5,694,369 | 12/1997 | Abe | 365/210 |

Primary Examiner—David Nelms
Assistant Examiner—Vanthu Nguyen
Attorney, Agent, or Firm—Hickman & Martine, LLP

[57] ABSTRACT

Disclosed is a method of designing a memory device on a semiconductor chip. The memory device includes a memory array having a depth that defines a number of words and a word width that defines a number of bits. The method of designing the memory device includes partitioning an address transition detect circuit into a plurality of ATD sub-circuits. Partitioning a clock buffer into a plurality of clock buffer sub-circuits. Distributing each of the plurality of ATD sub-circuits to each of the number of bits of the memory array. The method of designing the memory device further includes distributing each of the plurality of clock buffer sub-circuits to each of the number of bits of the memory array. In a further variation, the method may be used to distribute the ATD sub-circuits and the clock buffer sub-circuits to where the clock load is distributed for a particular memory device.

25 Claims, 8 Drawing Sheets

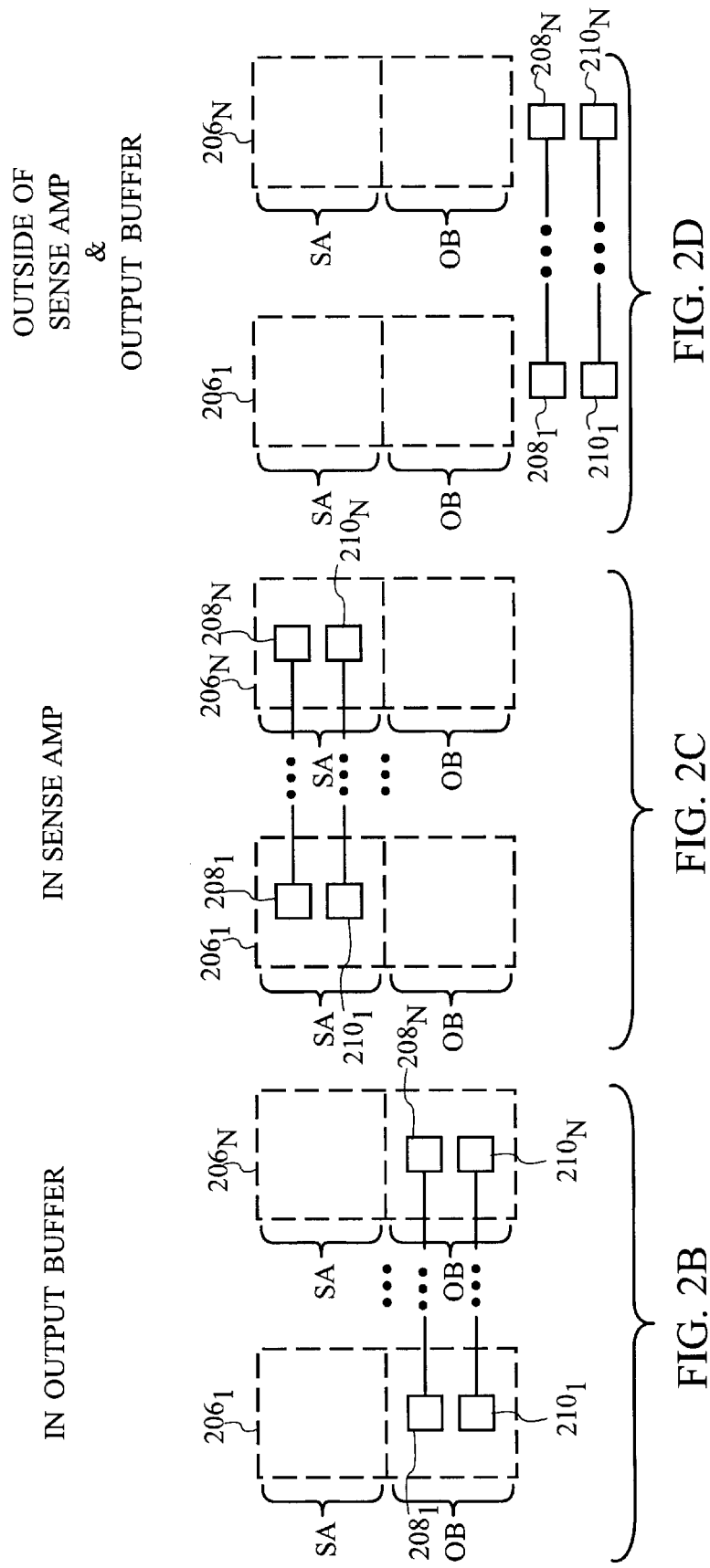

DISTRIBUTED BALANCED ADDRESS DETECTION AND CLOCK BUFFER CIRCUITRY AND METHODS FOR MAKING THE SAME

BACKGROUND OF THE INVENTION

1. Field of the Invention

The present invention relates generally to integrated circuits, and more particularly to distributed memory circuitry and methods for making the same.

2. Description of the Related Art

Most integrated circuit devices are required to have some type of memory device for storing information, and there is a growing trend to integrate embedded memory arrays directly onto the a chip, such as, a microprocessor, an application specific integrated circuit (ASIC), etc. Typically, when a memory device is embedded into a chip, the memory device (e.g., an Asynchronous SRAM) is provided with circuitry for writing and reading the data. By way of example, such common circuitry typically includes Y-decoders, X-decoders, sense amplifiers, output buffers, address transition detectors (ATD's) and clock buffers. Therefore, to produce a memory device that has fast access times and quick recoveries after a read/write operation, each of the components of the common circuitry must be tuned to eliminate delays or inefficiencies.

With this in mind, FIG. 1 shows a prior art block diagram of a memory 100 that is produced by a memory generator that may be embedded into an integrated circuit design. The memory 100 is shown having a memory array 102, which is the main memory array having a plurality of memory cells that are arranged in a row and column format. Typically, memory 100 is provided with a row decode 104, a column decode 106, control circuitry 105, an address transition detect (ATD) 110, and sense amplifiers and output buffers 107. It is these circuit components that are used to facilitate the writing and reading of data to or from selected cells in the memory array 102.

When the memory has an address transition detect (ATD) circuit 110, the memory is typically considered to be an asynchronous memory device. This is because the address transition detect (ATD) 110 will produce a clock input signal that is analogous to that produced by a synchronous memory device. By way of example, a synchronous memory device will have a "memory clock" signal that identifies a read or a write operation when a transition from LOW-to-HIGH (i.e., a rising edge) occurs, and commence a pre-charge operation when a transition from HIGH-to-LOW (i.e., a falling edge) occurs. As shown in a waveform 120, a time lapse between the falling edge and the next rising edge (i.e., when the next read or write operation occurs), is the time needed by the memory 100 to prepare itself for a next read or write operation. In this example, the ATD 110 is shown receiving an address transition input that provides information of when a memory address in the memory array 102 is to be accessed for a read or a write operation.

In prior art designs, the ATD 110 is also coupled to a clock buffer 112 that is well suited to provide a fixed amount of buffering/drive for a particular memory array 102. However, when the memory array 102 is replaced with a different size memory array, the clock buffer 112 will continue to produce the same fixed amount of drive (even though the load has changed). The possibility of interchanging different size memory arrays is not an uncommon occurrence. In fact, many companies implement what are known as core libraries, wherein the core libraries may include a plurality of memory arrays from which to pick an choose from. However, this increased flexibility may cause an integrated circuit design, e.g., a memory to be improperly matched for load. That is, the fixed clock buffer 112 that was well suited for use with the one size memory produced by a memory generator may not be well suited for a different size memory.

By way of example, if the new memory array is larger than the memory array that was previously produced by the memory generator, then there may be too little drive to compensate for the increased load. On the other hand, if the memory array 102 is replaced with a smaller sized memory array, then the fixed drive may be too large, thereby causing a slow down in the rate at which a read or a write operation may be performed. In either case, the clock buffer 112 of the memory 100 will also have to be replaced and tuned an increased cost each time the memory array 102 is modified. There are also tuning issues associated with the address transition circuitry, which is described in greater detail in a commonly assigned U.S. patent application having Ser. No. 08/928,713 (Attorney Docket Number ARTCP008), entitled "Self Adjusting Pre-Charge Delay in Memory Circuits and Methods for Making the Same," and filed on the same day as the instant patent application. This application is incorporated by reference herein.

In view of the foregoing, there is a need for a memory that has flexible clock buffer circuitry that may be distributed in response to a change in memory size.

SUMMARY OF THE INVENTION

Broadly speaking, the present invention fills these needs by providing distributed address transition detection and clock buffer circuitry. It should be appreciated that the present invention can be implemented in numerous ways, including as a process, an apparatus, a system, a device, or a method. Several embodiments of the present invention are described below.

In one embodiment, a method for making a memory device is disclosed. The method includes providing a memory generator having a set of parameters. Determining a number of bits in a word of the memory generator. The method further includes distributing a portion of an address transition detection unit and a portion of a clock buffer to each of the number of bits in the word of the memory generator.

In another embodiment, a memory device is disclosed. The memory device includes an address transition unit that is partitioned into a plurality of portions, and each of the plurality of portions of the address transition unit is evenly distributed to each bit of a memory array. The memory device further includes a clock buffer that is partitioned into the plurality of portions, and each of the plurality of portions of the clock buffer are evenly distributed to each bit of the memory array. Wherein a portion of the address transition unit and a portion of the clock buffer are coupled together at each bit of the memory array.

In yet another embodiment, a method of de signing a memory device on a semiconductor chip is disclosed. The memory device includes a memory array having a depth that defines a number of words and a word width that defines a number of bits. The method of designing the memory device includes partitioning an address transition detect circuit into a plurality of ATD sub-circuits. Partitioning a clock buffer into a plurality of clock buffer sub-circuits. Distributing each of the plurality of ATD sub-circuits to each of the number of bits of the memory array. The method of designing the memory device further includes distributing each of the plurality of clock buffer sub-circuits to each of the number of bits of the memory array.

In still another embodiment, a system of designing a memory on a semiconductor chip is disclosed. The memory generator produces a memory array having a depth that defines a number of words and a word width that defines a number of bits. The system of designing the memory generator includes means for partitioning an address transition detect circuit into a plurality of ATD sub-circuits. Means for partitioning a clock buffer into a plurality of clock buffer sub-circuits. Means for distributing each of the plurality of ATD sub-circuits to each of the number of bits of the memory array. The system of designing the memory generator further includes means for distributing each of the plurality of clock buffer sub-circuits to each of the number of bits of the memory array.

In still yet a further embodiment, a method of designing a memory device on a semiconductor chip is disclosed. The memory device preferably includes a memory array having a depth that defines a number of words and a word width that defines a number of bits. The memory device further includes a clock load that is coupled to either the number of bits or the number of words. The method includes partitioning an address transition detect circuit into a plurality of ATD sub-circuits. Partitioning a clock buffer into a plurality of clock buffer sub-circuits. Distributing each of the plurality of ATD sub-circuits to the clock load of the memory array. The method further includes distributing each of the plurality of clock buffer sub-circuits to the clock load of the memory device.

Advantageously, the various embodiments of the present invention provide methods and apparatuses for evenly distributing a portion of an address transition detect circuit and a portion of a clock buffer circuit to each bit a memory array, thereby enabling an even distribution of clock drive to a memory array. Therefore, if the size of the memory array changes (i.e., it is replaced with an array having a different number of bits), a portion of the address transition detect circuit and a portion of a clock buffer circuit will be distributed to every bit of the new memory array. The advantageous features of this distributed arrangement are therefore applicable to other memory arrangements, so long as the distribution is made in relation to where the load of the memory device is disposed. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIGS. 2B through 2D show alternative techniques for distributing a portion of an ATD and a portion of a clock buffer (CB) in accordance with alternative embodiments of the present invention.

DETAILED DESCRIPTION OF THE PREFERRED EMBODIMENTS

An invention for distributed address transition detection and clock buffer circuitry is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
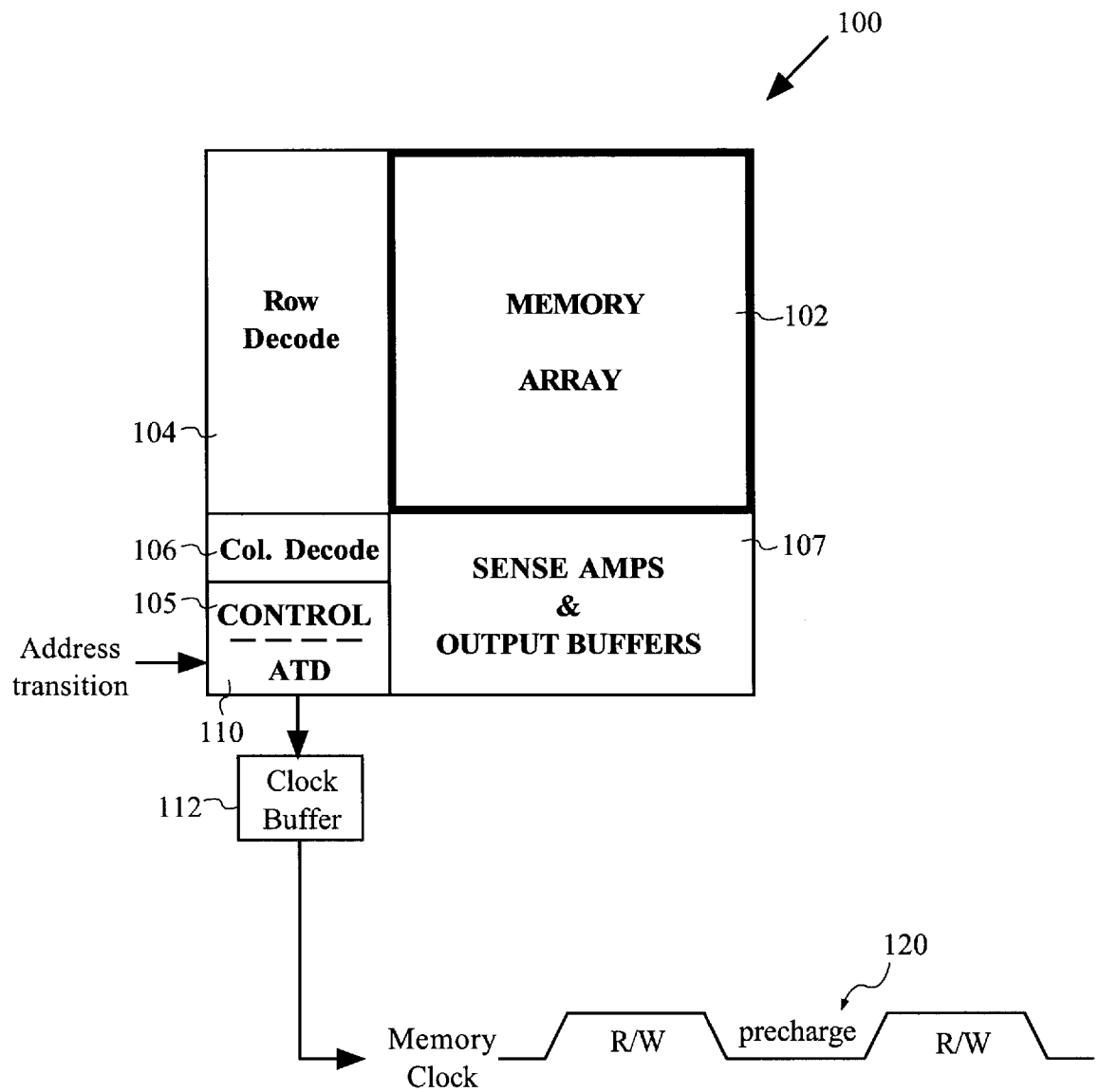
FIG. 1 shows a prior art block diagram of a memory that may be embedded into an integrated circuit design.
Figure 2A:
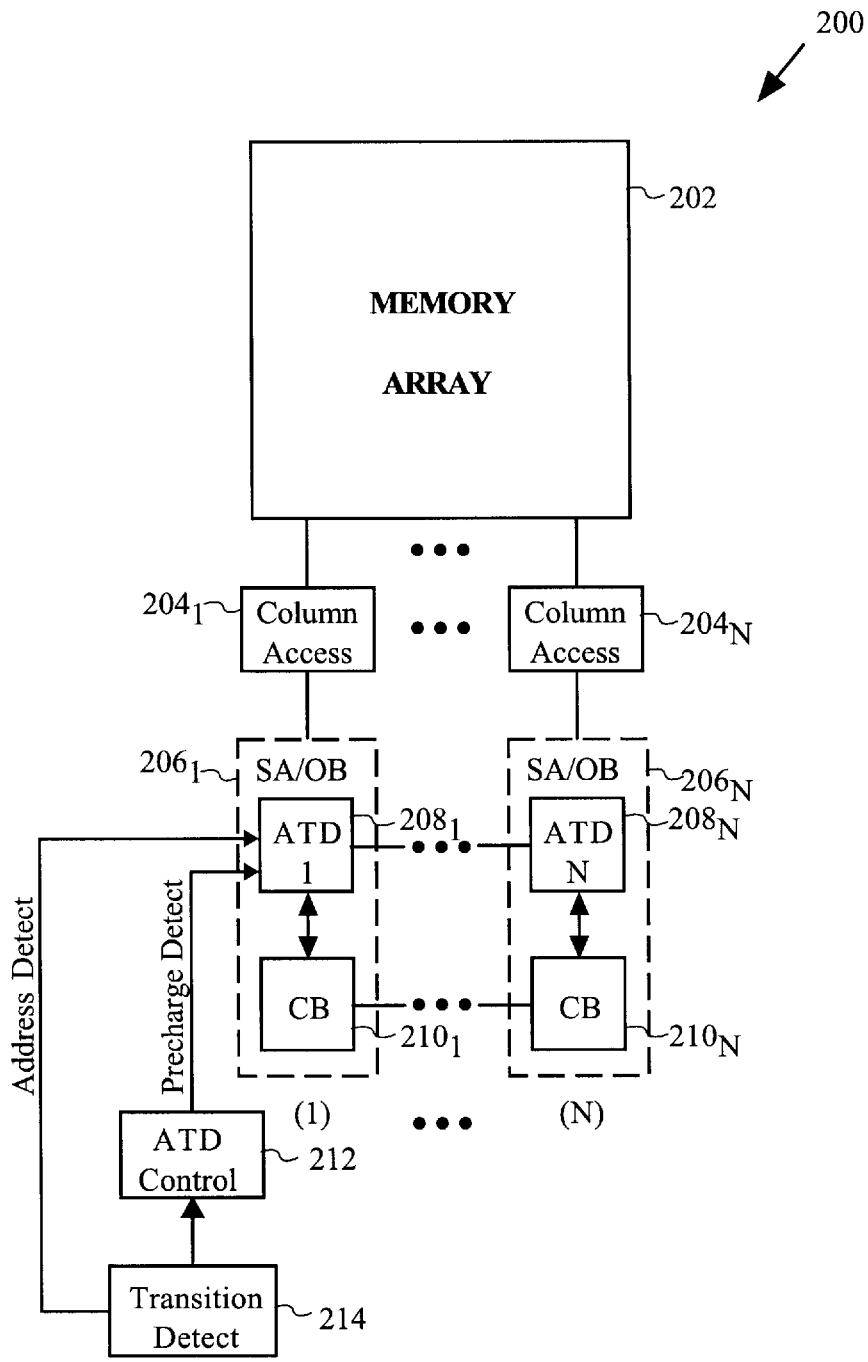
FIG. 2A shows a memory generator having a memory array and distributed circuitry for accessing data of the memory array in accordance with one embodiment of the present invention.

FIG. 2A shows a memory 200 produced by a memory generator, which includes a memory array 202 and associated circuitry for accessing data of the memory array 202 in accordance with one embodiment of the present invention. Memory array 202 is shown having column access circuitry $204_1$ through $204_N$, that may be used for controlling the aspect ratio of a given memory array. By way of example, the column access circuitry may include a Y-decoder for accessing m-bit lines, where "m" defines the number of times a single column is folded for maintaining a suitable array aspect ratio. Although one embodiment of the present invention discloses an asynchronous SRAM memory device, the embodiments of the present invention are equally applicable to any asynchronous memory device, such as a ROM, a RAM, a DRAM, an EPROM, an EEPROM, etc. For more information on memory devices, reference may be made to a book entitled "The Art of Electronics, 2nd Edition," by Paul Horowitz and Winfield Hill, pages 812–820 (1996). This book is hereby incorporated by reference.

Coupled to each of the column access circuitry $204_1$ through $204_N$, are associated sense amplifiers/output buffers $206_1$ through $206_N$. For more information on memory sense amplifiers and output buffers, reference may be made to commonly assigned U.S. patent Applications: (1) entitled "Sense Amplifying Methods and Sense Amplification Integrated Circuit Devices," having Ser. No. 08/797,347, and filed on Feb. 11, 1997; (2) entitled "High Speed Memory Output Circuitry And Methods for Implementing Same," having Ser. No. 08/806,335, and filed on Feb. 26, 1997; (3) entitled "High Speed Addressing Buffer and Methods For Implementing Same," having Ser. No. 08/837,611, and filed on Apr. 21, 1997; and (4) entitled "Voltage Sense Amplifier and Methods For Implementing the Same," having Ser. No. 08/839,151, and filed on Apr. 23, 1997. All above identified U.S. patent applications are incorporated by reference herein.

Integrated within each of the sense amplifiers and output buffers 206 is a portion of an address transition detector (ATD) 208 and an associated clock buffer (CB) 210. In this manner, there will be one ATD 208 and one CB 210 in each of the sense amplifiers/output buffers 206 that are coupled to the memory array 202, thereby ensuring that an optimized clock drive is achieved for a particular memory array size. By way of example, if memory array 202 is replaced with a larger or a smaller size memory array (i.e., more or less bits), a portion of the ATD 208 and the CB 210 will be distributed to each bit of the new memory array, no matter what the memory array size may be. In this manner, optimum load drive with minimum input capacitance may be provided at each CB 210, because all of the load, in this example, is in the column bits. Therefore, an increase in rows will not affect loading considerations.

As a further example, if the memory array is 32 bits wide, then there will be 32 ATDs 208 (i.e., sub-circuits) and CBs 210 (i.e., sub-circuits) distributed for each of the 32 sense amplifier/output buffers 206. However, if the memory array is a 128 bit memory array, then there will be 128 ATDs 208 and 128 CBs 210 distributed for each of the bits in the memory array 202. FIG. 2A further shows an ATD control 212, which is coupled to the ATDs 208 that provide a pre-charge detect signal. A transition detect 214 is also shown in communication with the ATD control 212 and the ATDs 208. In one embodiment, the output of the transition detect 214 that is coupled to the ATDs 208 is used to provide address detect signals.

Although the ATD 208 and CB 210 are shown distributed within the circuitry of both the sense amplifiers and output buffers 206, the ATDs 208 and CBs 210 may alternatively be integrated only in an output buffer portion of the sense amplifier/output buffer 206 as shown in FIG. 2B. As will be described in greater detail below, the case in which the ATDs 208 and the CBs 210 are integrated into the output buffer circuitry is shown in greater detail in an example of FIG. 6 below.

FIG. 2C shows yet another example in which the ATDs 208 and CBs 210 are integrated into only the sense amplifier circuitry of 206. In yet a further example, the ATDs 208 and the CBs 210 may be integrated outside the sense amplifier/ output buffers 206₁ through 206_N. Accordingly, it should be appreciated that the distributed nature of the ATDs 208 and CBs 210 provides a powerful flexibility that enables their integration in any circuit arrangement or layout, so long as a portion of the ATD 208 and CB 210 are coupled up to each bit of a given memory array. Of course, in other memory array designs, the ATDs 208 and CBs 210 may be distributed for each row of an array, when the clock load is coupled to the rows.

Figure 3:
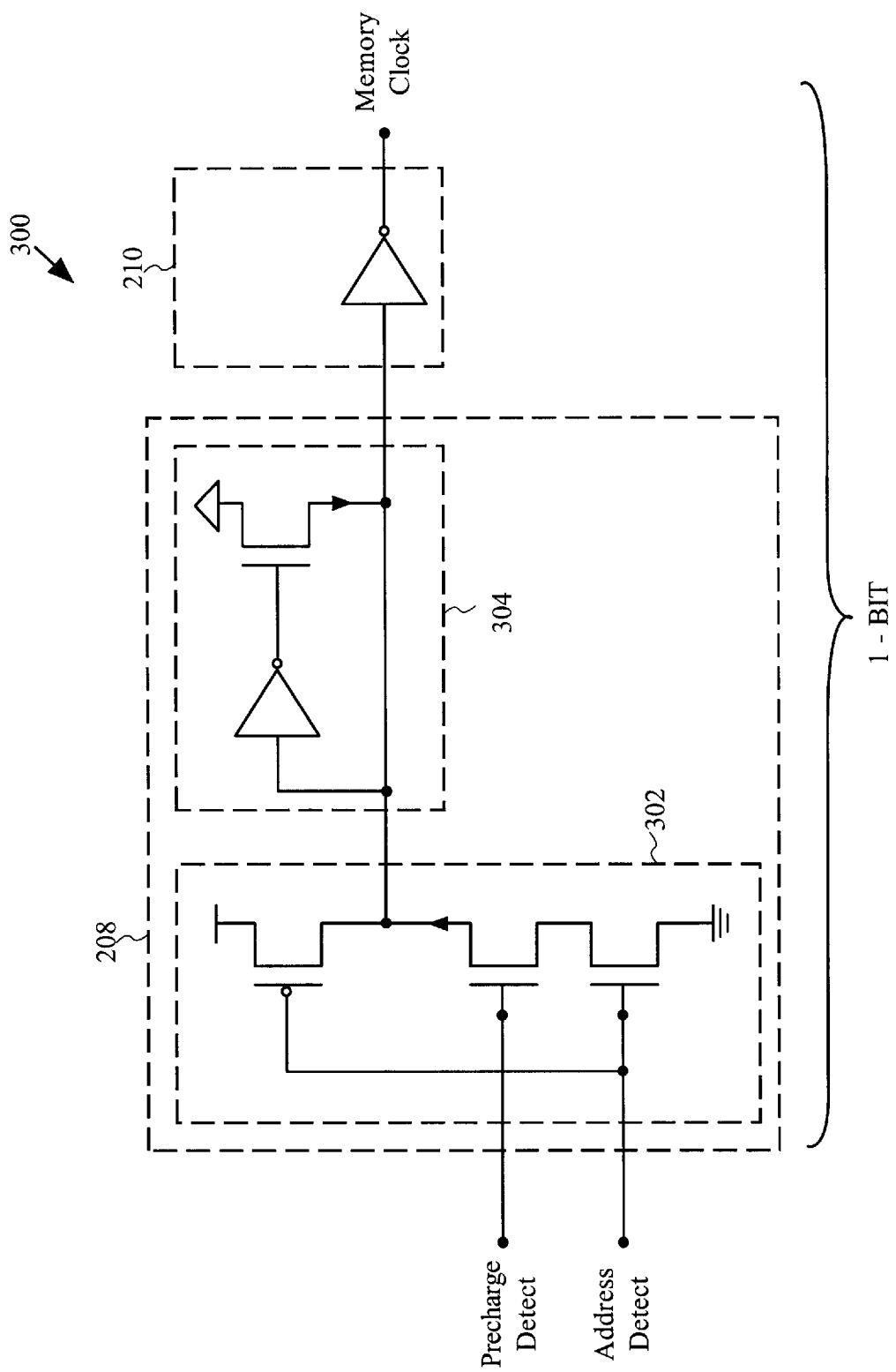
FIG. 3 shows a circuit diagram of an ATD and a clock buffer (CB) in accordance with one embodiment of the present invention.

FIG. 3 shows a circuit diagram 300 of an ATD 208 and a clock buffer (CB) 210 in accordance with one embodiment of the present invention. As shown, the ATD 208 has a NAND gate 302 and a keeper circuit 304. NAND gate 302 has one input from a pre charge detect signal and another input from an address detect as shown in FIG. 2A. The NAND gate is then shown coupled to the keeper circuit 304, that is in turn coupled to CB 210. CB 210 therefore generates a memory clock for one bit. It should be appreciated that in this example, the clock buffer is an inverter that is optimized, for speed (i.e., strong drive and low input capacitance), although, any other suitably optimized clock buffer circuitry will work as well. It is also most important to note that the circuitry 300 is repeated once for each bit in a given memory array (i.e., once for each bit of a bus width). In this manner, the distributed nature of the ATDs 208 and the CBs 210 will provide superior clock load matching for any size memory array 202. Further, the distributed arrangement will also provide optimal drive and reduced input capacitance characteristics in asynchronous memories.

Figure 4:
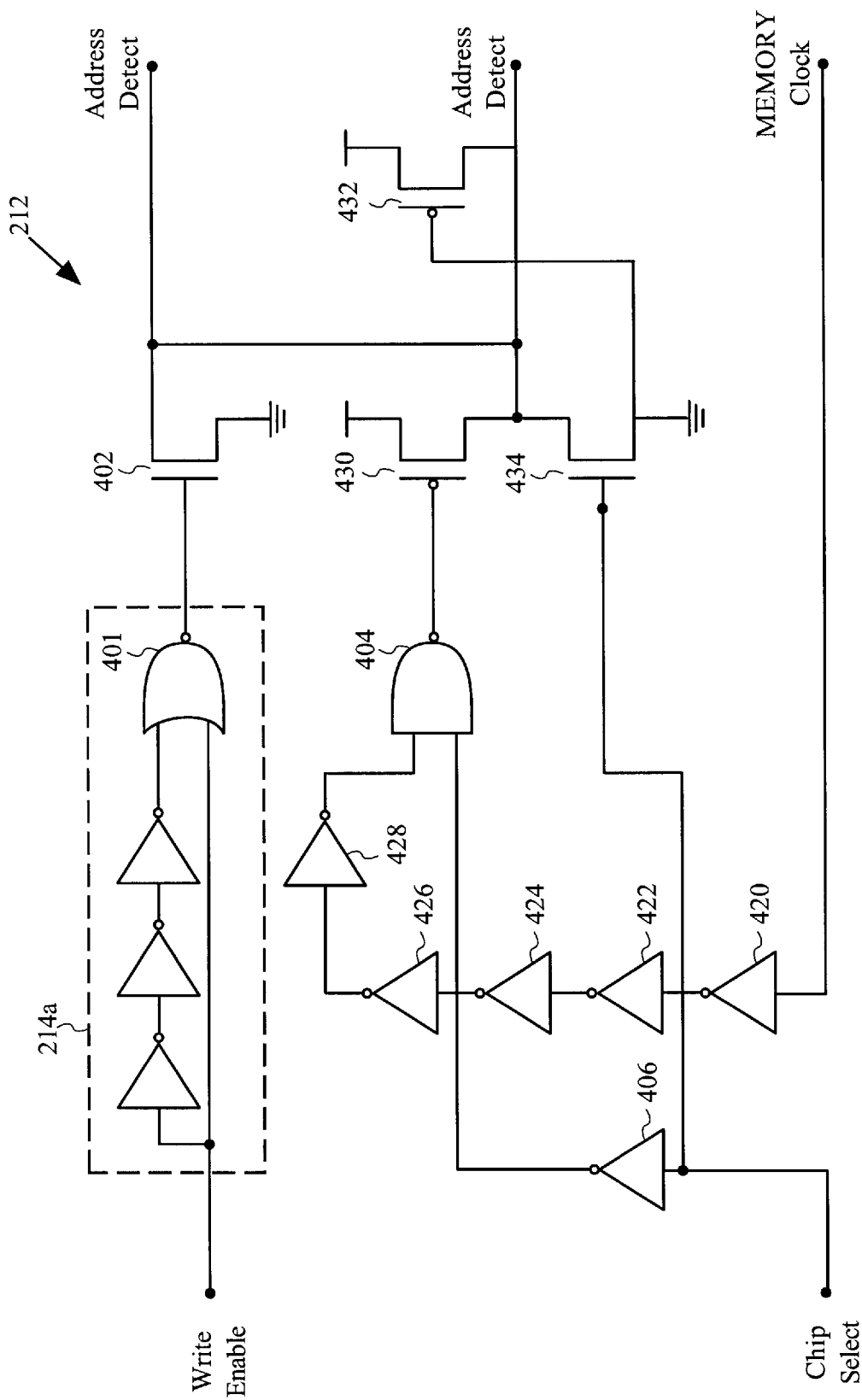
FIG. 4 is a circuit diagram of the circuitry contained within an ATD control of FIG. 2A in accordance with one embodiment of the present invention.

FIG. 4 is a circuit diagram of the circuitry contained within ATD control 212 of FIG. 2A in accordance with one embodiment of the present invention. ATD control 212 generally includes a write enable terminal, a chip select terminal, address detect terminals, and a memory clock terminal. The write enable terminal is coupled to a portion of the transition detect circuitry 214a, which includes three inverters and a NOR gate 401 that leads to a gate of a transistor 402. Transistor 402 has one terminal coupled to ground and another terminal coupled to an address detect terminal.

Chip select terminal is shown coupled to an inverter 406 that leads to a NAND gate 404. Chip select is also coupled to a gate of a transistor 434 and a gate of a transistor 432. The terminals of the transistor 434 are coupled between ground and a terminal of transistor 430. Memory clock is shown coupled to a plurality of buffering inverters 420, 422, 424, 426, and 428. The signal output from inverter 428 is provided as an input to the NAND gate 404.

Figure 5:
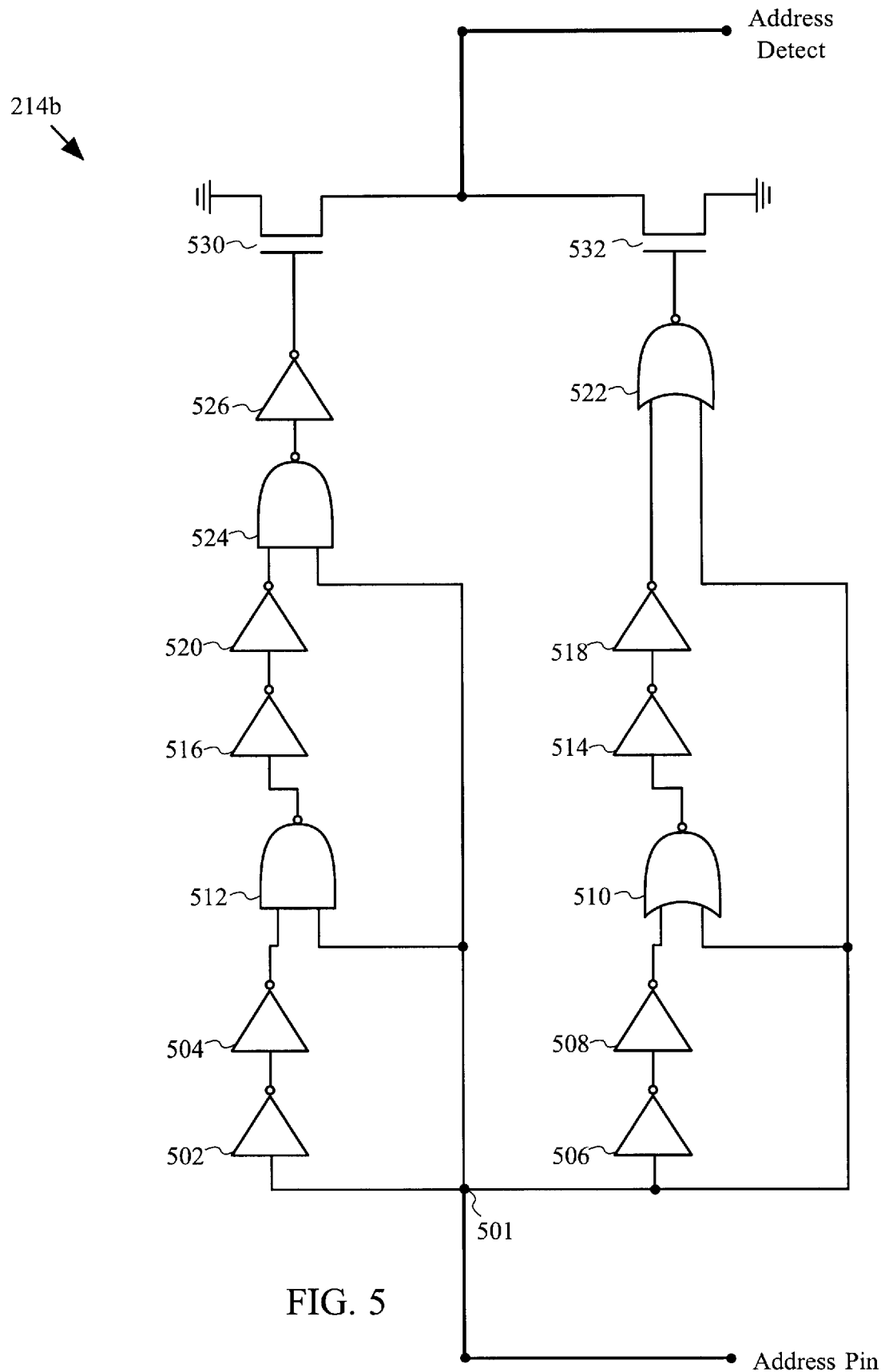
FIG. 5 shows a more detailed diagram of the logic circuitry contained within the transition detect circuitry of FIG. 2A in accordance with one embodiment of the present invention.

FIG. 5 shows a more detailed diagram of the logic circuitry 214b contained within the transition detect circuitry 214 of FIG. 2A in accordance with one embodiment of the present invention. As shown, an address pin terminal, which represents an address pin for one address, is coupled to a node 501. Node 501 is therefore coupled as an input to an inverter 502, an inverter 506, a NAND gate 512, and a NOR gate 510. Inverter 502 is shown having an output that is connected to inverter 504, and inverter 506 is shown having an output that is connected to an inverter 508.

The output of inverter 508 is then coupled as an input to the NOR gate 510, and the output of inverter 504 is shown as one input to the NAND gate 512. The output of NAND gate 512 is shown as an input to an inverter 516, the output of inverter 516 is shown as an input to an inverter 520, and the output of inverter 520 is shown as one input to a NAND gate 524. The other input of NAND gate 524 is the original signal passed through node 501. The output of NAND gate 524 is therefore shown as an input to an inverter 526 and the output of inverter 526 is passed to a gate of a transistor 530. In a like manner, the output of NOR gate 510 is shown as an input to an inverter 514, the output of inverter 514 is shown as an input to an inverter 518, and the output of inverter 518 is shown as an input to a NOR gate 522. The other input to NOR gate 522 is shown as the original signal provided through node 501. The output of NOR gate 522 is therefore shown as an input to a gate of a transistor 532. As such, the address detect signal that is provided to the ATD control 212 and the ATD 208 of FIG. 2A is selected through the use of the transistors 530 and 532.

Figure 6:
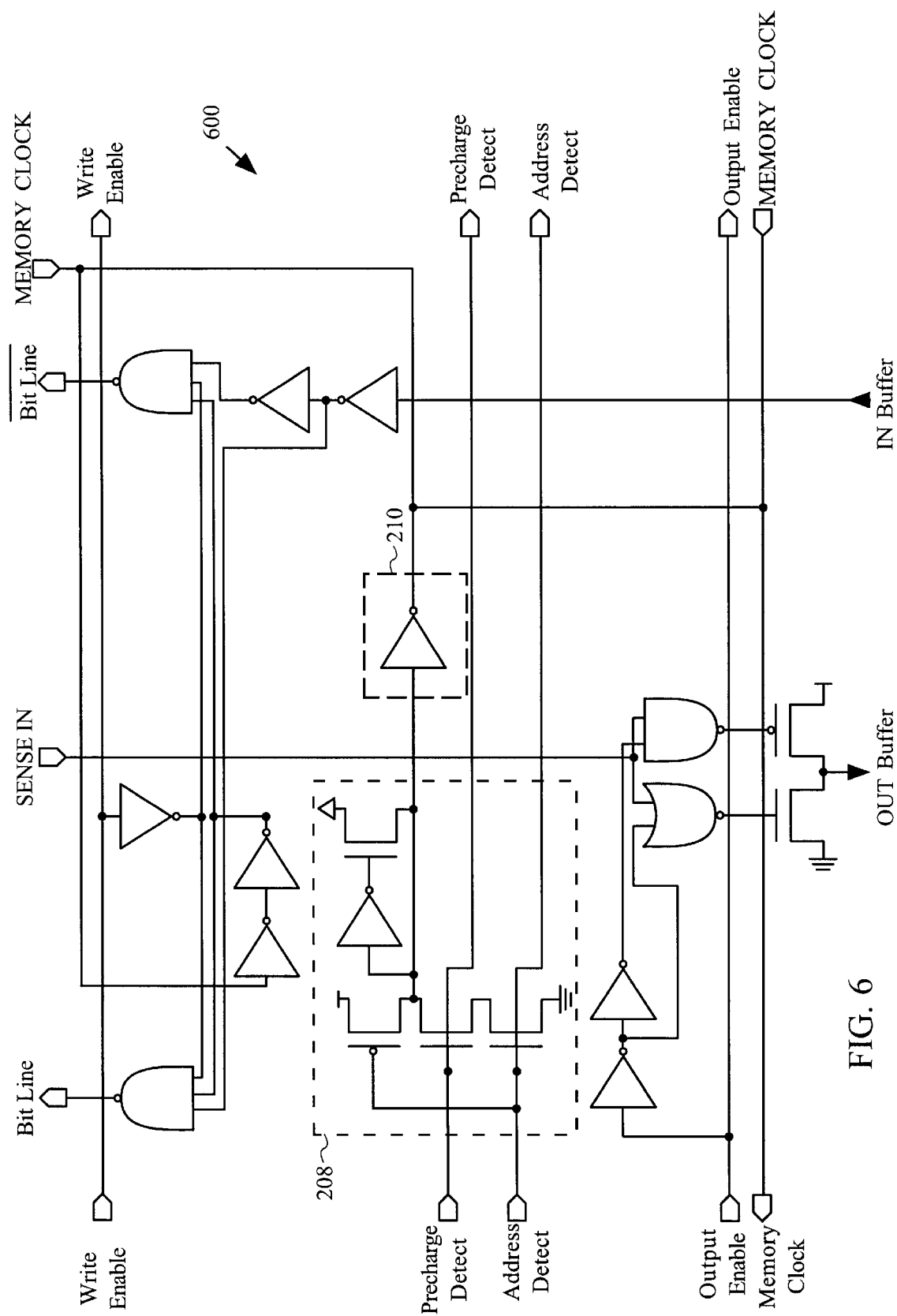
FIG. 6 shows a circuit diagram of an output buffer having a portion of an ATD and a portion of a clock buffer (CB) in accordance with one embodiment of the present invention.

FIG. 6 shows a circuit diagram 600 of an output buffer having a portion of an ATD 208 and a portion of a clock buffer 210 in accordance with one embodiment of the present invention. As mentioned above, the ATD 208 and the clock buffer 210 may be laid out in any portion of a circuit that is used for accessing data (i.e., read or write operations) in a memory device. Accordingly, the output buffer circuitry 600 should only be viewed as an exemplary circuit diagram, that contains a portion of a distributed ATD and a distributed clock buffer. The output buffer circuitry 600 is shown having a bit line, a /bit line, a sense in, a write enable, a memory clock, a pre-charge detect, an address detect, an output enable, a buffer out, and a buffer in. Generally, the pre-charge detect and the address detect will be coupled to each of the ATDs 208 in parallel (i.e., 208₁ through 208_N). The output of each clock buffer 210 is shown leading to the memory clock (210₁ through 210_N).

Figure 7:
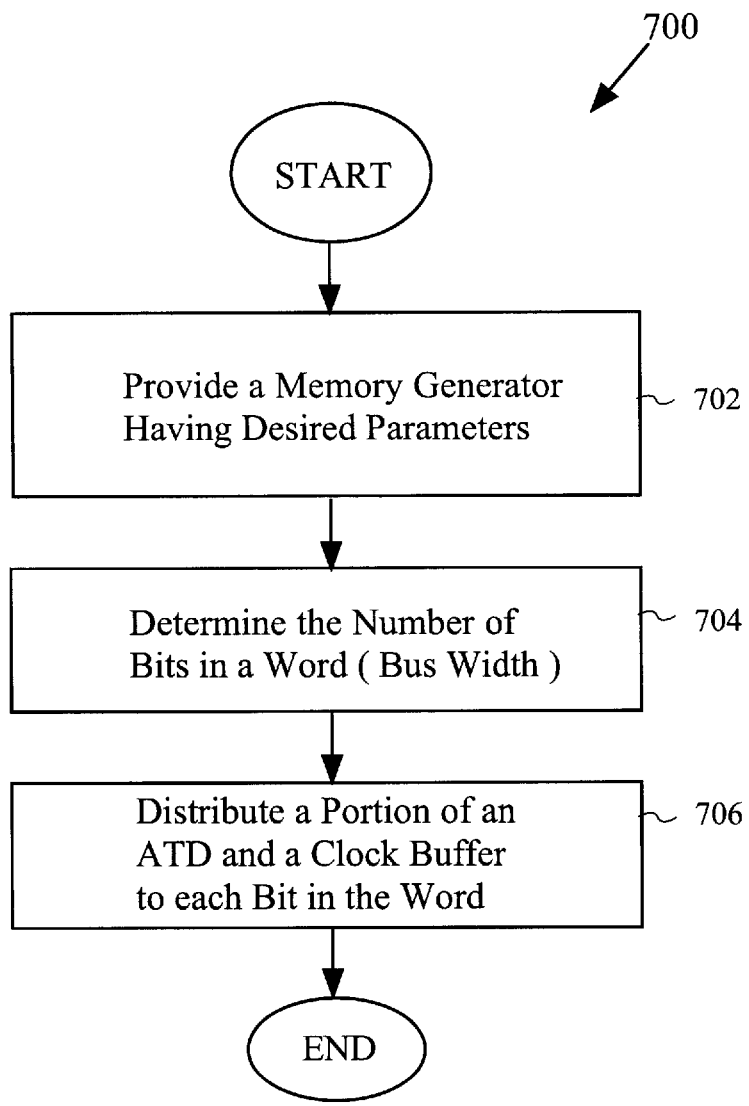
FIG. 7 is flowchart diagram illustrating the preferred method operations that may be used in constructing a memory generator in accordance with one embodiment of the present invention.

FIG. 7 is flowchart diagram 700 illustrating the preferred method operations that may be used in constructing a memory in accordance with one embodiment of the present invention. The method begins at an operation 702 where a memory generator having desired parameters is provided. By way of example, the memory generator may create a memory array having a particular depth (i.e., number of words), a particular number of bits (i.e., number of bits in a data bus), and a particular number of multiplexors for controlling aspect ratio.

Once the desired memory generator having the desired parameters is selected in operation 702, the method will proceed to an operation 704 where the number of bits in a word (bus width) is determined. By way of example, the bus width may be 32 bits, 64 bits, 128 bits, etc. Once the number of bits in the word are determined in operation 704, the method will proceed to an operation 706. In operation 706, a portion of an address transition detect (ATD) and a portion of the clock buffer (CB) is distributed to each bit in the word determined in operation 704. Once a portion of the ATD and the clock buffer have been distributed to each bit in the word, the method will end. It should be understood, that in this exemplary case, the ATD and clock buffer are distributed in relation to the number of bits, however, in other cases, the ATD and clock buffer may be distributed per number of rows or any other distributed arrangement depending on where the clock load is laid out. Therefore, the method or memory generator may be modified to distribute the ATD sub-circuits and the clock buffer sub-circuits to where the clock load is distributed for a particular memory device.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation. By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

What is claimed is:

1. A method for making a memory device, comprising:
   providing a memory generator having a set of parameters;
   determining a number of bits in a word of the memory generator, wherein each bit of the number of bits in the word is defined as a bitline pair; and
   distributing a portion of an address transition detection unit and a portion of a clock buffer to each of the number of bits in the word of a memory generated by the memory generator such that each portion of the address transition detection unit and each portion of the clock buffer are in communication with each other.

2. A method for making a memory device as recited in claim 1, wherein the set of parameters of the memory generator include a depth parameter that defines a number of words.

3. A method for making a memory device as recited in claim 2, wherein the set of parameters of the memory generator include a word width that defines the number of bits of the memory generator.

4. A method for making a memory device as recited in claim 3, wherein the portion of the address transition detect unit is used to detect a transition in an address that is coupled to each of the number of bits in the word of the memory generator.

5. A method for making a memory device as recited in claim 4, wherein each portion of the address transition detect unit includes a three transistor NAND gate and a keeper circuit.

6. A method for making a memory device as recited in claim 5, wherein each portion of the clock buffer includes an inverter that is optimized for drive and reduced input capacitance at each one of the number of bits in the word of the memory generator.

7. A method for making a memory device as recited in claim 6, wherein the memory device further includes an address transition detect control circuit that is coupled in parallel to each of the portions of the address transition detect units.

8. A method for making a memory device as recited in claim 7, wherein the memory device further includes a transition detect circuit that is coupled to the address transition detect circuit and coupled in parallel to each of the portions of the address transition detect units.

9. A method for making a memory device as recited in claim 7, wherein the memory device is fabricated into a semiconductor chip.

10. A memory device, comprising:
    an address transition unit being partitioned into a plurality of portions, each of the plurality of portions of the address transition unit being evenly distributed to each bit of a memory array such that each bit represents a bitline pair; and
    a clock buffer being partitioned into the plurality of portions, each of the plurality of portions of the clock buffer being evenly distributed to each bit of the memory array, such that a portion of the address transition unit and a portion of the clock buffer are coupled together at each bit of the memory array.

11. A memory device as recited in claim 10, wherein when each of the plurality of portions of the clock buffer and address transition detect unit is evenly distributed to each bit of the memory array, an optimized drive and reduced input capacitance is provided for each bit of the memory array.

12. A memory device as recited in claim 10, wherein an output of the portion of the address transition unit is coupled as an input to the portion of the clock buffer at each bit of the memory array.

13. A memory device as recited in claim 12, further comprising:
    an address transition control circuit for outputting a pre-charge detect signal to each of the plurality of portions of the clock buffer and address transition detect unit; and
    an address transition detect circuit that generates a first output that is coupled to the address transition control circuit and a second output that generates an address detect signal to each of the plurality of portions of the clock buffer and address transition detect unit.

14. A memory device as recited in claim 13, wherein the pre-charge detect signal and the address detect signal are coupled in parallel to each of the plurality of portions of the address transition unit and each of the plurality of portions of the clock buffer.

15. A method of designing a memory device on a semiconductor chip, the memory device including a memory array having a depth that defines a number of words and a word width that defines a number of bits, such that each bit represents a bitline pair, comprising:

partitioning an address transition detect circuit into a plurality of ATD sub-circuits;

partitioning a clock buffer into a plurality of clock buffer sub-circuits;

distributing each of the plurality of ATD sub-circuits to each of the number of bits of the memory array;

distributing each of the plurality of clock buffer sub-circuits to each of the number of bits of the memory array; and arranging respective ones of the plurality of ATD sub-circuits to respective ones of the plurality of clock buffer sub-circuits for each of the number of bits of the memory array.

16. A method of designing a memory device on a semiconductor chip as recited in claim 15, wherein each of the plurality of ATD sub-circuits include a three transistor NAND gate and a keeper circuit.

17. A method of designing a memory device on a semiconductor chip as recited in claim 16, wherein each of the plurality of clock buffer sub-circuits include an inverter that is optimized for drive and input capacitance.

18. A method of designing a memory device on a semiconductor chip as recited in claim 16, further comprising:

an address transition control circuit for outputting a pre-charge detect signal to each of the plurality of ATD sub-circuits and each of the plurality of clock buffer sub-circuits; and an address transition detect circuit that generates a first output that is coupled to the address transition control circuit and a second output that generates an address detect signal each of the plurality of ATD sub-circuits and each of the plurality of clock buffer sub-circuits.

19. A method of designing a memory device on a semiconductor chip as recited in claim 18, wherein the memory device is an asynchronous memory selected from the group consisting of a ROM, a RAM, a DRAM, an SRAM, an EPROM, and a EEPROM.

20. A system of designing a memory on a semiconductor chip using a memory generator, the memory including a memory array having a depth that defines a number of words and a word width that defines a number of bits, and each bit represents a bitline pair, comprising:

means for partitioning an address transition detect circuit into a plurality of ATD sub-circuits;

means for partitioning a clock buffer into a plurality of clock buffer sub-circuits;

means for distributing each of the plurality of ATD sub-circuits to each of the number of bits of the memory array;

means for distributing each of the plurality of clock buffer sub-circuits to each of the number of bits of the memory array; and means for coupling respective ones of the plurality of ATD sub-circuits to respective ones of the plurality of clock buffer sub-circuits for each of the number of bits of the memory array.

21. A system of designing a memory on a semiconductor chip as recited in 20, wherein each of the plurality of ATD sub-circuits include a three transistor NAND gate and a keeper circuit.

22. A system of designing a memory on a semiconductor chip as recited in 21, wherein the memory generator is an asynchronous memory selected from the group consisting of a ROM, a RAM, a DRAM, an SRAM, an EPROM, and a EEPROM.

23. A method of designing a memory device on a semiconductor chip, the memory device including a memory array having a depth that defines a number of words and a word width that defines a number of bits, each bit represented by a bitline pair, and the memory device having a clock load that is coupled to one of the number of bits and the number of words, comprising:

partitioning an address transition detect circuit into a plurality of ATD sub-circuits;

partitioning a clock buffer into a plurality of clock buffer sub-circuits;

distributing each of the plurality of ATD sub-circuits to the clock load of the memory device;

distributing each of the plurality of clock buffer sub-circuits to the clock load of the memory device; and coupling respective ones of the plurality of ATD sub-circuits to respective ones of the plurality of clock buffer sub-circuits for connecting to each of the number of bits of the memory device or each of the number of words.

24. A method of designing a memory device on a semiconductor chip as recited in claim 23, wherein each of the plurality of ATD sub-circuits include a three transistor NAND gate and a keeper circuit.

25. A method of designing a memory device on a semiconductor chip as recited in claim 24, wherein each of the plurality of clock buffer sub-circuits include an inverter that is optimized for drive and input capacitance.

* * * * *